United States Patent [19]
Ard

[11] Patent Number: 5,793,319
[45] Date of Patent: Aug. 11, 1998

[54] ANALOG TO DIGITAL LINEARIZING APPARATUS, SYSTEM AND METHOD

[75] Inventor: Mark Duan Ard, Santa Clara, Calif.

[73] Assignees: Ricoh Company, Ltd., Tokyo, Japan; Ricoh Corporation, San Jose, Calif.

[21] Appl. No.: 753,762

[22] Filed: Nov. 29, 1996

[51] Int. Cl.[6] ................................................ H03M 1/10
[52] U.S. Cl. ........................................ 341/120; 341/155
[58] Field of Search ................................ 341/120, 118, 341/119, 121, 131, 139; 367/35

[56] References Cited

U.S. PATENT DOCUMENTS 4,551,823  11/1985  Carmichael et al. .................... 367/35

OTHER PUBLICATIONS

Analog–Digital Conversion Handbook, by The Engineering Staff of Analog Devices, Inc. pp. 614–615, 1986.

*Primary Examiner*—Brian K. Young
*Attorney, Agent, or Firm*—Oblon, Spivak, McClelland, Maier & Neustadt, P.C.

[57] ABSTRACT

An analog to digital conversion apparatus, method and system accepts an analog input signal having analog values ranging from an analog minimum to an analog maximum and converts the analog input signal into a digital signal. The digital signal includes X-bit numbers, where X is an integer greater than one, according to a truncated transfer function, which includes a linear portion of a full-scale transfer function of an analog-to-digital converter. A range of the truncated transfer function is bounded by a truncated maximum number corresponding to the analog maximum and a truncated minimum number corresponding to the analog minimum. The range of the truncated transfer function is set, through a calibration procedure, to be within the full-scale transfer function of the analog-to-digital converter. The digital signal is then either output in X-bit numbers or in corresponding Y-bit numbers, where Y is an integer and $Y<X$.

20 Claims, 7 Drawing Sheets

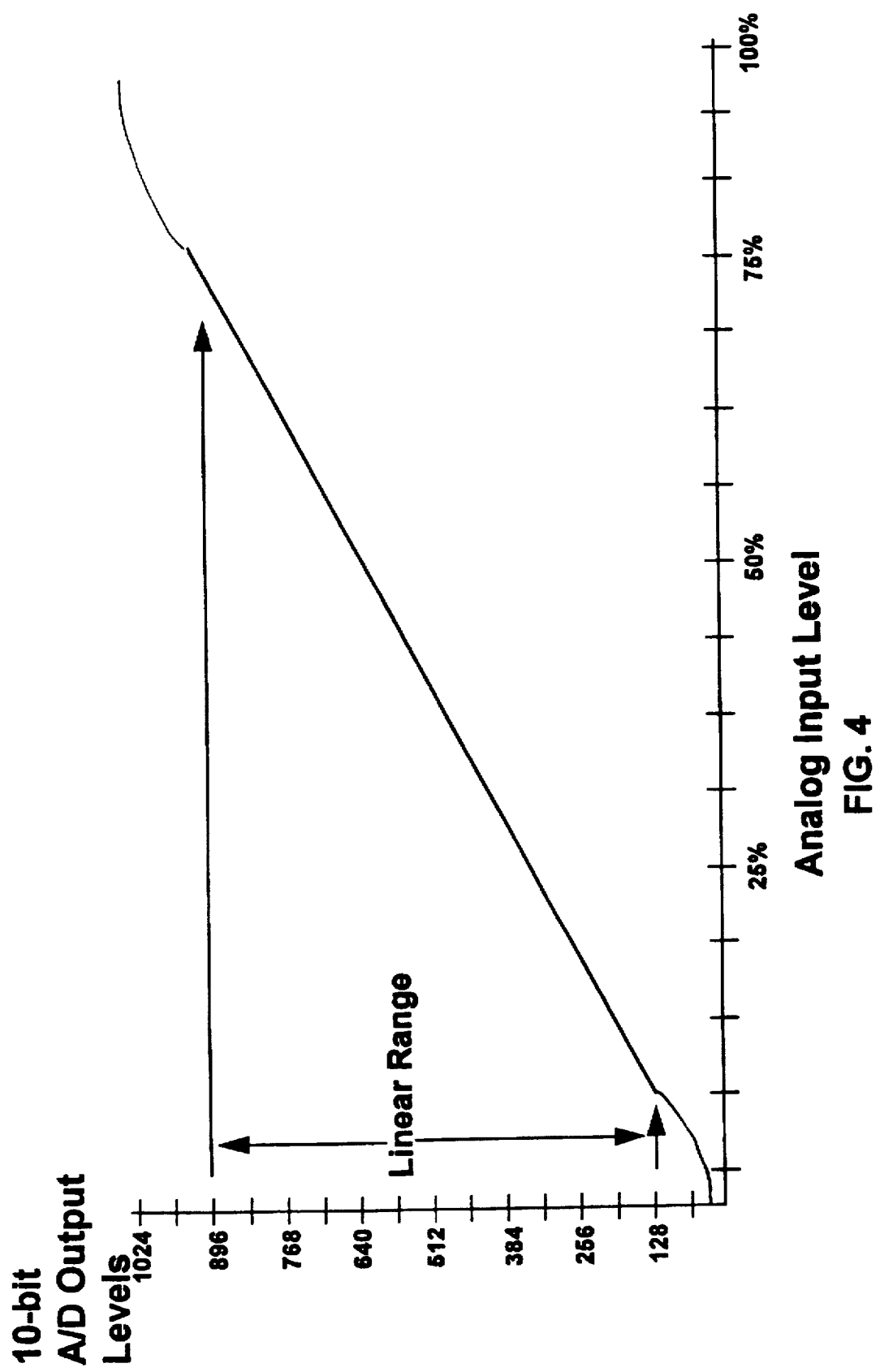

ANALOG TO DIGITAL LINEARIZING APPARATUS, SYSTEM AND METHOD

BACKGROUND OF THE INVENTION

1. Field of the Invention

The present invention relates to systems, apparatuses and methods that convert analog signals into digital signals using linear digitization techniques.

2. Discussion of the Background

Analog-to-digital (A/D) converters are used in a variety of communication, control and other applications in which digital signals representing analog signals are manipulated using digital signal processing techniques. A/D converters perform the function of accepting an analog signal, typically in the form of a continuous, non-discrete, electrical voltage, and converting the analog signal into a digital signal (i.e., a series of numbers) that represent the analog signal. Avoiding the inherent difficulties associated with analog signal manipulation by converting the analog signal into a digital format, computer-based process, and digital logic based processes (e.g., application specific integrated circuits) are conveniently employed to manipulate the digital signal.

FIG. 1 is a graph of a full-scale range transfer function of an ideal 10-bit A/D converter. The abscissa, X-axis, represents an analog input level, which is usually measured in arbitrary voltage units, expressed in terms of a percentage of a maximum analog input value (e.g., a maximum input voltage). The ordinate, Y-axis, represents 1024 (i.e., $2^{10}$) quantization levels, where 10 is the number of bits output by the A/D converter, into which the A/D converter will map sampled portions of the analog input signals. Each quantization level corresponds to a voltage range identified by the equation:

X=(full scale range)/# of quantization levels.

In the example shown in FIG. 1, assuming 100% equates 10 V, X equals 10/1024, or approximately 0.0098 V. Due to the finite resolution of FIG. 1, the A/D converter's transfer function is shown as a straight line, although at a higher resolution the transfer function would have a familiar "stairstep" shape, which is a common characteristic of A/D converters.

Suppose an analog input level of 50% (i.e., mid-range) is applied to the ideal A/D converter, as shown by the vertical arrow in FIG. 1. In response, the 10-bit A/D converter will associate the 50% input value into the 512th quantization level, as shown by the horizontal arrow in FIG. 1, and will output a 10-bit number which is a binary equivalent to the decimal number 512. If a second analog input signal is applied at a slightly higher voltage (e.g., say at a level that corresponds to the next highest quantization level), the A/D converter will output a second 10-bit number which is a binary equivalent to the decimal number 513.

While the precision with which A/D converters represent a given analog input level is affected by the A/D converter's resolution (i.e., represented by a number of effective bits provided by the A/D converter), integral linearity errors also limit the performance of A/D converters. Integral linearity is a measure of how far an A/D converter's transfer function deviates from an ideal straight line. The integral linearity error increases with the deviation amount.

One way to correct for an integral nonlinearity is to "map" specific A/D converter output values with corresponding compensated values. Substituting the compensated values for the A/D converter output values removes the non-linear shape of the A/D converter transfer function. More particularly, for each A/D converter quantization level, corresponding ranges of input analog voltages are recorded in a look-up table stored in memory. Because the ranges are set to compensate for the A/D converter's integral non-linearity, the respective ranges will vary in the respective amounts of input signals to which they correspond.

A problem with this mapping approach, as identified and addressed by the present invention, is that the non-linear shape of a subject A/D converter must first be completely characterized before a map can be generated to compensate for the integral nonlinearity. Accordingly, the complete range of the A/D converter must be mapped by sequentially applying analog input values and monitoring associated A/D converter output numbers. This approach is time intensive and complicates integration for end users of the A/D converter.

Some A/D converters require an accurate, known reference voltage to be applied thereto so to avoid introducing a non-linear response at an upper end of the upper and lower ends of the A/D converter's transfer function. It is generally believed that the precision of an A/D converter depends on the accuracy by which the "full scale" reference voltage is regulated, and "errors" result if the reference voltage deviates. As explained in "Analog-Digital Conversion Handbook", The Engineering Staff of Analog Devices, Inc., Prentice Hall, 1986, pages 614–615 (the contents of this book are incorporated herein by reference), if the reference is in error, it will create errors in the device, instrument, or system it is connected to. Thus, the emphasis on conventional A/D converters is to provide ideal references as a "full scale reference" that does not vary as a function of output voltage, load changes, temperature or time.

Most signal processing applications employ A/D converters that are matched to a system requirement in terms of the number of bits of resolution required to satisfy the system error requirements. If the resolution of the A/D converter is insufficient, additional techniques such as oversampling must be used in order to provide adequate system performance. As addressed by the present invention, cost is a design constraint in commercial applications and thus A/D converters having a greatest amount of resolution with minimum number of output bits are typically used because they generally cost less than A/D converters having greater than necessary resolution (assuming all other factors remain constant).

Some A/D converters employ one or more types of "coding" schemes to improve various aspects of system performance. Aside from direct binary coding (e.g., representing digital output values as binary numbers), other codes are available such as binary coded decimal, gray codes, and complementary codes, for example. These codes either employ a 1-to-1 mapping or add more bits to each A/D output number so redundancy is added to the output number and system error rate performance is enhanced. However, as identified and addressed by the present invention, adding bits in some cases reduces performance and ease of system design.

FIG. 2 is a block diagram of a conventional A/D conversion circuit in which pixels of a charge coupled device (CCD) 1 provide respective analog signals to an A/D converter 3. The A/D converter 3 operates over the A/D converter's full scale range to convert each of the analog signals into a corresponding stream of 10-bit digital numbers (i.e., a digital signal). The A/D converter passes the 10-bit numbers over a bus 11. A memory 7, also attached to the bus 11, receives the 10-bit digital numbers and maps them into a corresponding new 10-bit digital number (or a greater number of bits if coding is used) in which a non-linearity introduced by the A/D converter 3 is removed.

During a calibration mode of operation, a full scale range signal is applied from the CCD 1 to the A/D converter 3, and a control device 13 generates an output data value used by a D/A converter 9 to adjust the output of the A/D converter 3 to produce a full-scale range output. More particularly, the D/A converter 9, in response to the control signal, generates a full scale direct current (DC) reference voltage which is applied to the A/D converter 3 as the A/D converter's "full scale" reference voltage.

As will be addressed by the present invention, one limitation with the conventional A/D conversion circuit of FIG. 2 is that a complex mapping procedure is required in order to remove nonlinearities of the A/D converter 3. A second limitation with the A/D converter circuit of FIG. 2, also addressed by the present invention, is that the output of the A/D converter 3 is provided in a 10-bit format that is subject to jitter.

SUMMARY OF THE INVENTION

Accordingly, one object of this invention is to provide a novel method, apparatus and system for converting analog signals into digital signals that overcome the above-mentioned limitations of the relevant art.

It is a further object of the invention to provide a method, apparatus and system for providing a linearly transformed digital output signal in response to an analog input signal by applying a less than full-scale reference voltage to an A/D converter.

It is another object of this invention to provide a novel method, apparatus and system for converting analog signals into digital signals and providing the digital signals in a format having less bits than that provided by an A/D converter.

It is yet another object of the present invention to provide a method, apparatus and system for providing a truncated A/D converter transfer function that improves linear performance.

It is still a further object of the invention to provide a method, apparatus and system for calibrating an A/D converter by adjusting an A/D converter reference signal to less than a full scale range so as to improve system linearity.

The present invention is directed to a novel apparatus, system and method for converting analog signals into digital signals that includes adjusting an A/D converter with a DC reference voltage for respective pixels of a charge coupled device, where the respective DC reference voltage is less than a full-scale reference voltage used to operate the A/D converter over its normal full scale range. The DC reference voltage is adjusted such that a maximum analog input signal produces a corresponding digital output signal that is 12.5% below a maximum number that can be output by the A/D converter. When the A/D converter's response is within a predetermined range about a level that is 12.5% above a minimum A/D converter output number, the DC reference voltage is then readjusted to ensure a +0 volt analog input signal produces a corresponding digital signal that is 12.5% above the minimum A/D converter output number. However, if the output digital signal is not within a predetermined range about the level that is 12.5% above minimum A/D converter output number, the DC reference voltage is adjusted by adding/subtracting a commensurate offset value so as to center the "truncated" transfer function of the A/D converter within the middle 75% portion of the A/D converter's full scale dynamic range. The reference voltage is then adjusted for a third time so as to "fine tune" the positioning of the truncated transfer function within the most linear portion of the A/D converter's full scale dynamic range. By adjusting the DC reference voltage according to this method, only the most linear portion of an A/D converter's transfer function is used for converting analog signals to digital signals.

Consistent with the linear digital signal provided by the A/D converter using the truncated transfer function, the present invention outputs the digital signal in a data format having a lesser number of bits than that provided by the A/D converter. By reducing the number of bits, system performance is improved by reducing "jitter" and matching digital signal word lengths with signal processing circuits used to manipulate the digital signals.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4 is a graph of an analog input level versus A/D output level truncated transfer function according to the present invention;

DESCRIPTION OF THE PREFERRED EMBODIMENTS

Figure 1:
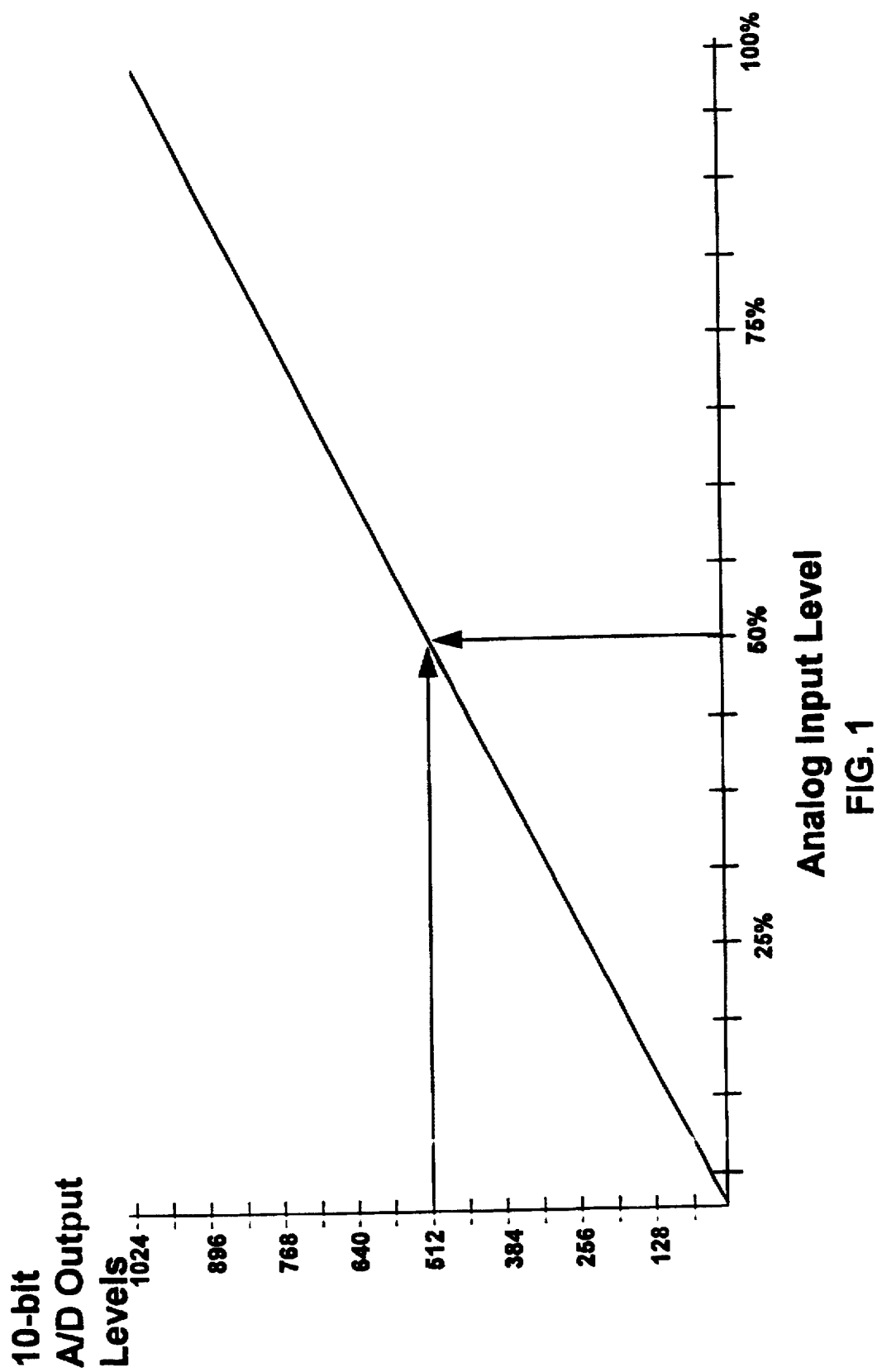
FIG. 1 is a graph of an analog input level versus a 10-bit A/D output level for an exemplary analog to digital converter.
Figure 2:
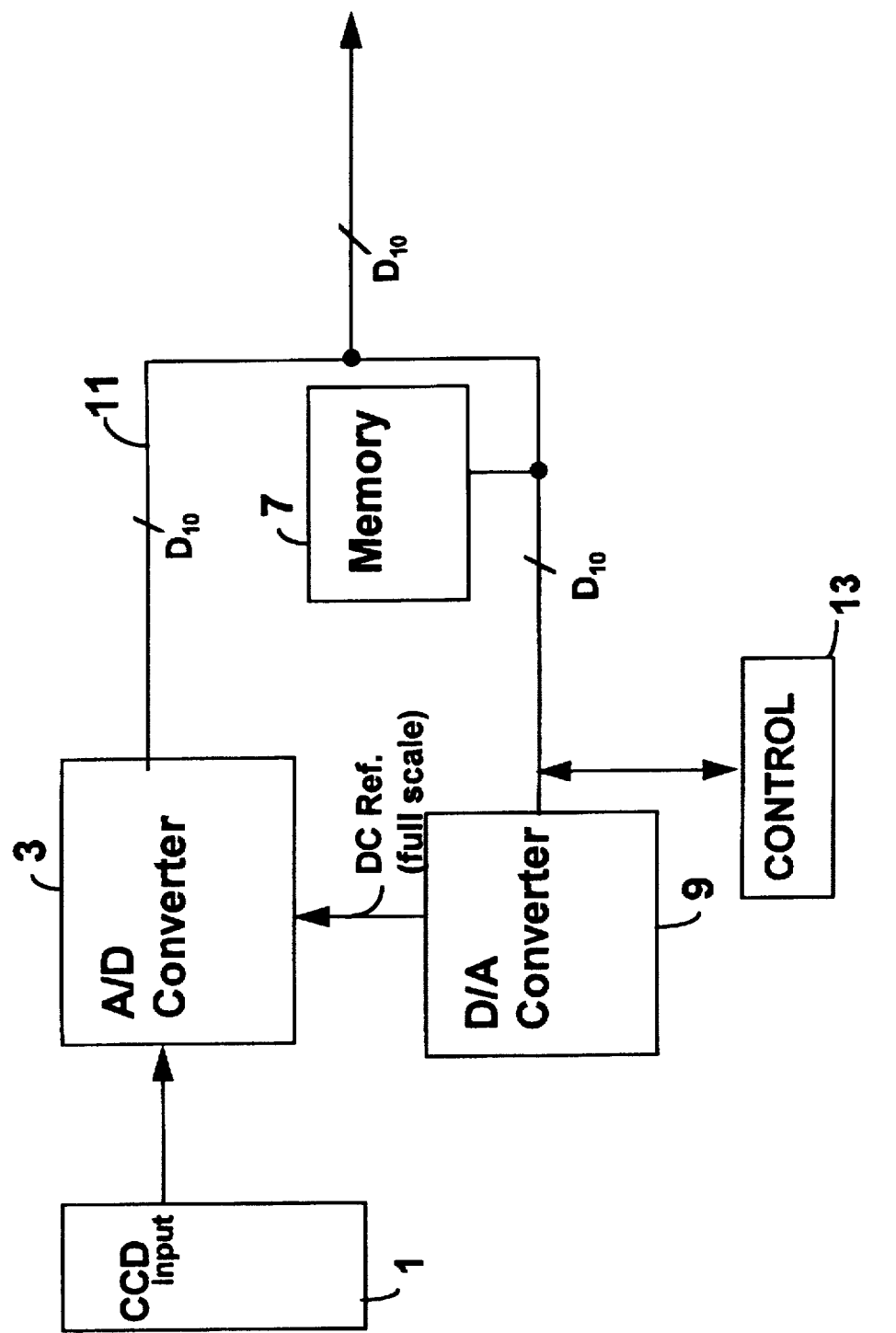
FIG. 2 is a block diagram of a related art A/D conversion circuit using a full scale reference.
Figure 3:
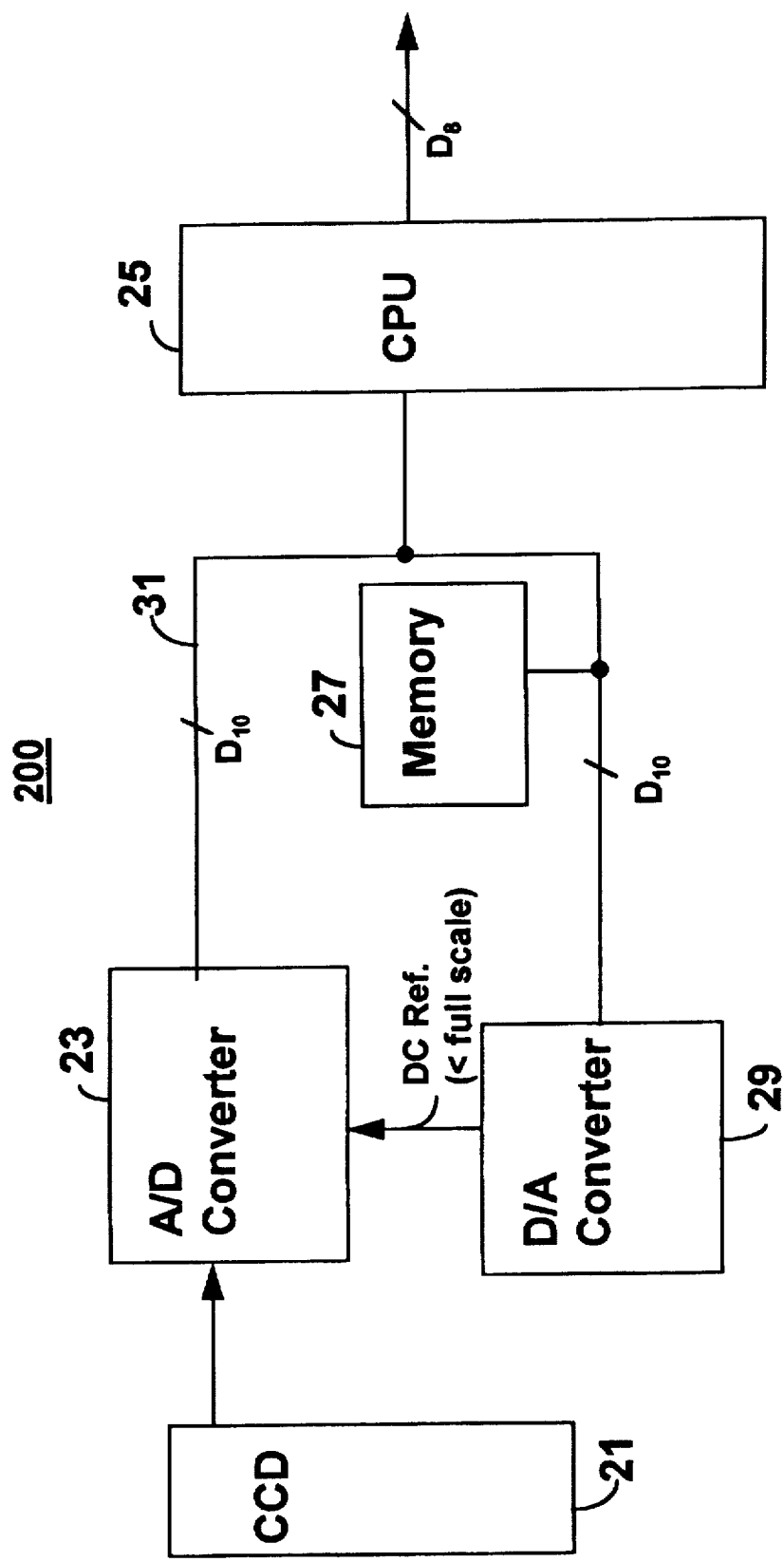
FIG. 3 is a block diagram of an analog to digital conversion circuit according to the present invention.

Referring now to the drawings, wherein like reference numerals designate identical or corresponding parts throughout the several views, and more particularly to FIG. 3 thereof, there is illustrated an analog-to-digital (A/D) conversion circuit 200. A charge coupled device 21 (CCD) (or alternatively another analog signal source) includes a pixel array containing a large number of pixels such as those used in Ricoh scanners, e.g., Model Nos. 510 and 520, and generates analog signals for each CCD pixel. The analog signals are provided to an A/D converter 23 (e.g., such as an AD579 available from Analog Devices, Inc.) that will be described as a 10-bit A/D converter, although the invention applies to other A/D converters as well. A given analog signal from the CCD 21 is converted into a digital signal in a 10-bit format by the A/D convertor 23 and the digital signal is placed on a data bus 31 (shown as a 10-bit data bus, although other buses such as standard PCI, ISA and custom buses are suitable).

The 10-bit bus 31 connects to a central processing unit (CPU) 25 (which is preferably a microcontroller, although general purpose CPU's, application specific integrated circuits, etc., are suitable as well). The CPU 25 includes mapping and calibration software code used by the CPU 25 to convert the 10-bit numbers of the digital signal into corresponding 8-bit numbers.

Memory 27 also connects to the databus 31 and, under control of the CPU 25, stores initialization and predetermined system threshold values, and a table of reference values each corresponding to respective pixels of the CCD 21. The reference values are applied to a digital to analog (D/A) converter 29 when respective analog signals from the pixels of the CCD 21 are converted into a digital format by the A/D converter 23.

During an operational mode, the D/A converter 29 uses an earlier supplied reference calibration value provided by the CPU 25 via the memory 27 to produce a corresponding analog output voltage, labelled as "DC Ref. (<full scale)" in FIG. 3. This DC reference voltage is applied to the A/D converter 23 at a level which is less than a "full scale" reference voltage specified for the specific A/D converter 23. The reason why a less than full scale reference voltage is used is explained below with reference to FIG. 4.

FIG. 4 is a graph of a transfer function showing an analog input level on the abscissa and 1024 quantization level corresponding to a normal full scale range of the A/D converter 23 (FIG. 3). The A/D converter 23 is shown as having a non-linear transfer function with pronounced non-linearities at the respective upper and lower ends of the A/D converter's full scale range (e.g., at the highest quantization level 1024 and at the lowest quantization level 0). The present invention mitigates the performance degrading effects of this nonlinear transfer function by using a middle 75% portion (see FIG. 4) of the A/D converter's full transfer function. The middle portion is used because it is a most linear portion of the transfer function. The remaining 25% (12.5% at the upper end and 12.5% on the lower end), having more pronounced deviations from an ideal linear transfer function, are "truncated", and thus not used. While the middle 75% range is illustrated herein as being the "linear range", experimentation with specific A/D converters may result in linear ranges that are greater than or less than the exemplary 75% range used herein.

Only the linear range of the A/D converter transfer function is used to convert the analog signals and thus is referred to as a "truncated" transfer function that uses only the quantization levels between 128 and 896, as shown in FIG. 4, to represent all analog input values. Using the truncated transfer function compromises breadth of dynamic range for improved linearity, which, at least in the case of CCD-based scanner systems, improves image quality in a cost-effective manner without significantly compromising breadth of gray scale resolution.

More generally, the truncated transfer function range (TTFR) is related to the normal (full) transfer function range (NTFR) by the relationship TTFR=X(NTFR), where X is a percentage of the NTFR empirically identified as being the most linear portion of the NTFR. The upper-most quantization levels which are truncated from the TTFR are bounded by the following:

MAX: the highest quantization level (HQL)
TRUNCATED MAX+1: HQL(1−0.5(1−X))+1.

Similarly, the lower-most quantization levels which are truncated from the TTFR are bounded by the following:

MIN: 0
TRUNCATED MIN −1:0.5HQL(1−X)−1.

The Truncated Max and Truncated Min are set by a calibration process that will now be introduced, but will be described in more detail with respect to FIGS. 5A and 5B. A goal of the calibration procedure is to place the TTFR within the NTFR based on a range of analog signals provided by the CCD 21 when specific pixels of the CCD 21 are exposed to an ideal "white" reference and exposed to an ideal "black" reference (i.e., a level 3.0 density according to industry standards, such as Association for Information and Image Management). When exposed to the ideal white and black references, a pixel of the CCD 21 will produce respective maximum and minimum analog signals that correspond to the Truncated Max and Truncated Min of the TTFR. The CPU 25 adjusts the D/A converter 29 to produce a "DC Ref" signal that causes the A/D converter 23 to produce the Truncated Max and Truncated Min signals when respectively exposed to the white and black references.

Figure 5A:
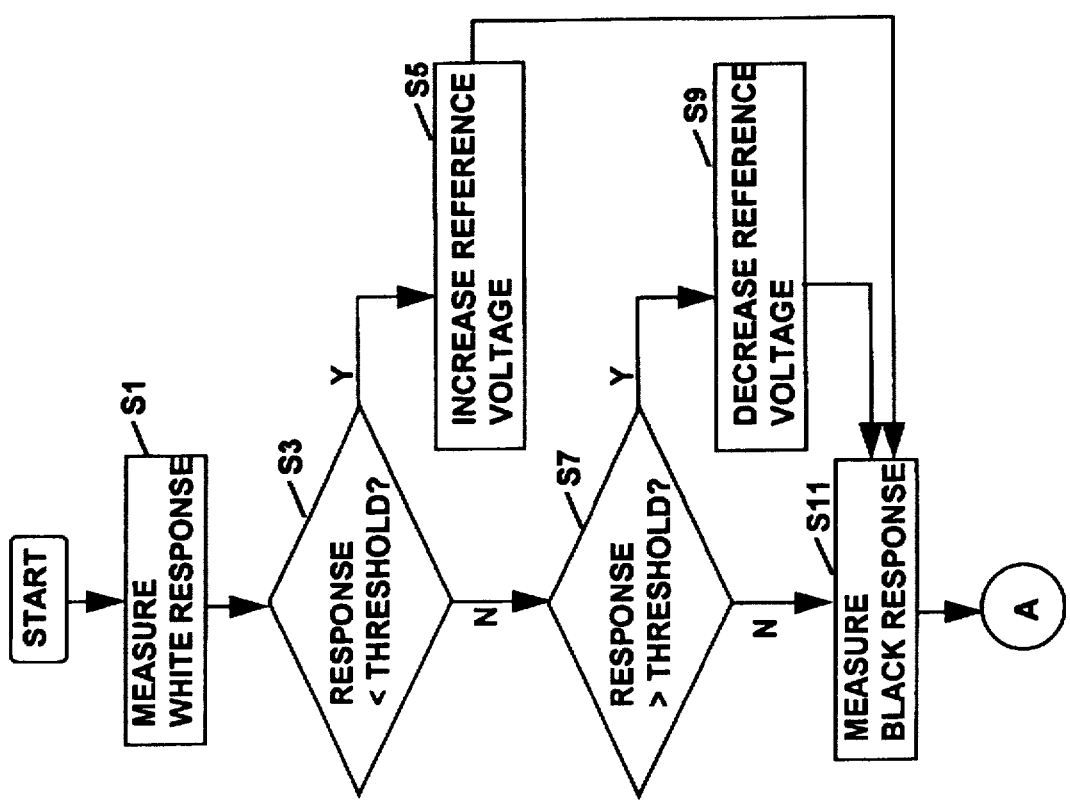
FIG. 5A is a first-half of a flow diagram of a calibration process used to calibrate the A/D conversion circuit of FIG. 3.
Figure 5B:
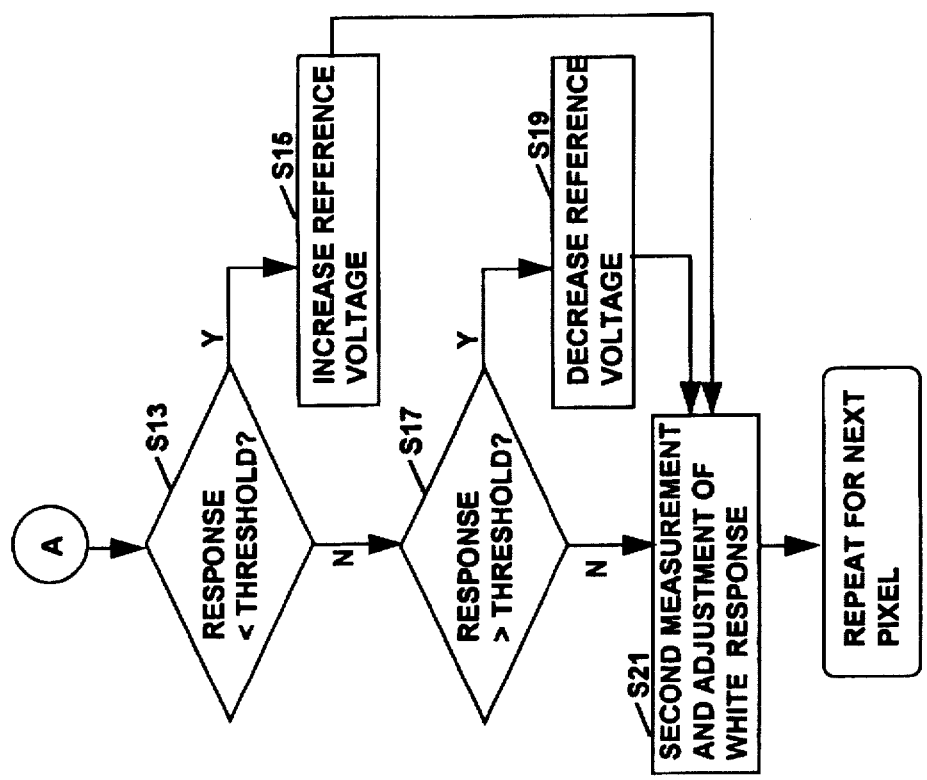
FIG. 5B is a second-half of a flow diagram of a calibration process used to calibrate the A/D conversion circuit of FIG. 3.

FIGS. 5A and 5B are respective first and second half portions of a flowchart that describe a preferred calibration procedure for calibrating the A/D conversion circuit 200 of FIG. 3. The method begins in step Si where a first CCD pixel element of the CCD 21 is exposed to a white reference and generates an analog output signal in response thereto. The corresponding analog output is provided to the A/D converter 23 (FIG. 3) which responds by producing a stream of 10-bit digital numbers (which are generally the same number, aside from jittering) corresponding the quantization level in which the analog output voltage is measured by the A/D converter 23.

The process then proceeds to step S3 where one of the 10-bit digital numbers (MDAC) is passed over the bus 31 to the CPU 25 where the CPU 25 which stores the 10-bit digital word (MDAC). The CPU 25 compares the 10-bit digital word with a threshold representing the Truncated MAX quantization level (e.g., level 896 as shown in FIG. 4). If the CPU 25 determines that the A/D converter's response to the white reference is less than the threshold in step S3, the process proceeds to step S5. In step 5S the CPU increases the value of a new 10-bit data word passed to the D/A converter 29 by an amount relative to previously stored 10-bit data word (stored the last time the subject pixel was calibrated). The increase amount is proportional to a measured amount by which the measured response is below the Truncated Max value. The new 10-bit data word (X1) is stored in the memory 27 and then the process proceeds to step S11. However, if the response in step S3 is negative, the process proceeds to step S7 where the CPU 25 determines whether the response is greater than the threshold value. If the response is greater than the threshold value, the process flows to step S9 where the 10-bit data word provided to the D/A converter 29 is decreased by an amount proportional to an amount by which the measured amount is above the Truncated Max threshold. Subsequently, the new 10-bit data word is stored the memory 27 and the process proceeds to step S11. However, if a negative response is received in step S7, indicating the response was equal to the threshold voltage, the 10-bit data word is not changed in the memory 27 and the process flows directly to step S11. In step S11, a black reference is applied to the same CCD pixel of the CCD 21, and a measured response of the A/D converter 23 to the black reference is measured in step S11.

As shown in FIG. 5A, after step S11, the process flows to step S13 where the CPU 25 compares the response of the A/D converter 23 to a Truncated MIN threshold (e.g., corresponding to the quantization level identified as 128) in order to determine whether the response is less than the threshold value. If an affirmative reply is received in step S13, the process proceeds to step S15 where the 10-bit data word provided to the D/A converter 29 is increased in value so that the number provided by the A/D converter will be 128, as long as the response value is 16 or less quantization levels from the Truncated MIN threshold. If the response is more than 16 quantization levels from the Truncated MIN threshold, a hypothetical 10-bit data value (X2hyp) corresponding to an amount of adjustment required to make the black response coincide with the Truncated MIN threshold is determined. Subsequently, the CPU 25 retrieves the earlier stored 10-bit data value (X1) corresponding to the white response, and a new 10-bit data (X3) value is calculated as an average of X1 and X2hyp and the new value (X3) is stored by the CPU 25 in the memory 27 as the new 10-bit data value.

If, however, the response to the inquiry in step S13 is negative, the process proceeds to step S17 where the CPU 25 determines whether the response of the A/D converter 23 is greater than the threshold, and if the response is greater, the process flows to S19. In step S19, the reference voltage is decreased by decreasing the 10-bit data value so that the A/D converter's response to the black reference equals 128, provided that the amount of adjustment is constrained to 16 quantization levels or less. If adjustment by more than 16 quantization levels is needed, the CPU averages a hypothetical adjustment value (X2hyp) with the previously stored 10-bit data value (X1) to provide an averaged 10-bit value (X3) which is stored by the CPU 25 in the memory 27 as the 10-bit data value to be applied to the D/A converter 29, and the process flows to step S21. If, the response to step S17 is negative, the process flows directly to step S21, indicating that the response to the black threshold equaled the 128 value.

In step S21, the white reference is once again applied to the CCD pixel of the CCD 21 and the A/D converters'response is measured. The 10-bit data value is adjusted once again so to make the white reference value equal to Threshold MAX if the response is within three quantization levels of the stored 10-bit data value, and then the adjusted 10-bit data value is stored in the memory 27. However, if the response of the A/D converter 23 to the white reference is more than three quantization levels different than the Threshold MAX, the CPU 25 averages the stored 10-bit data word (X3) with a new hypothetical 10-bit data word (X4hyp) to produce an averaged 10-bit data word (X5), where the value X4hyp is an amount of adjustment needed so that the A/D converter 23 produces a response at the Threshold MAX. The averaged 10-bit data word X5 is then stored in the memory 27. After step S21, the process repeats for each of the other pixels in the CCD 21 until each pixel has an associated 10-bit data word stored in the memory 27.

Accordingly, each 10-bit data word stored in the memory 27 is the result of a white-black-white calibration process that iteratively "fine-tunes" the 10-bit data word supplied to the D/A converter 29 so that only the most linear portion of the A/D converter's transfer function will be used to convert the respective analog signals provided by the pixels of the CCD 21.

The reason why the calibration process adjusts the reference voltage three separate times is because each time the DC reference voltage is adjusted, the effective dynamic range of the A/D converter is also affected. For example, if the reference voltage is increased, the digital output which is proportional to the ratio of the analog input to the reference signal, will decrease by the same percentage. On the other hand, if the reference is allowed to decrease, the digital output will increase by the same percentage. Although unconventional, the reference voltage provided by the digital to analog converter 29 is purposefully set below a full scale reference such that the truncated transfer function of the A/D converter 23 is set within a linear region of the A/D converter's transfer function.

While the above-described calibration process has been described with reference to specific levels and amounts of adjustment, the present invention is clearly applicable in a more general context.

Figure 6:
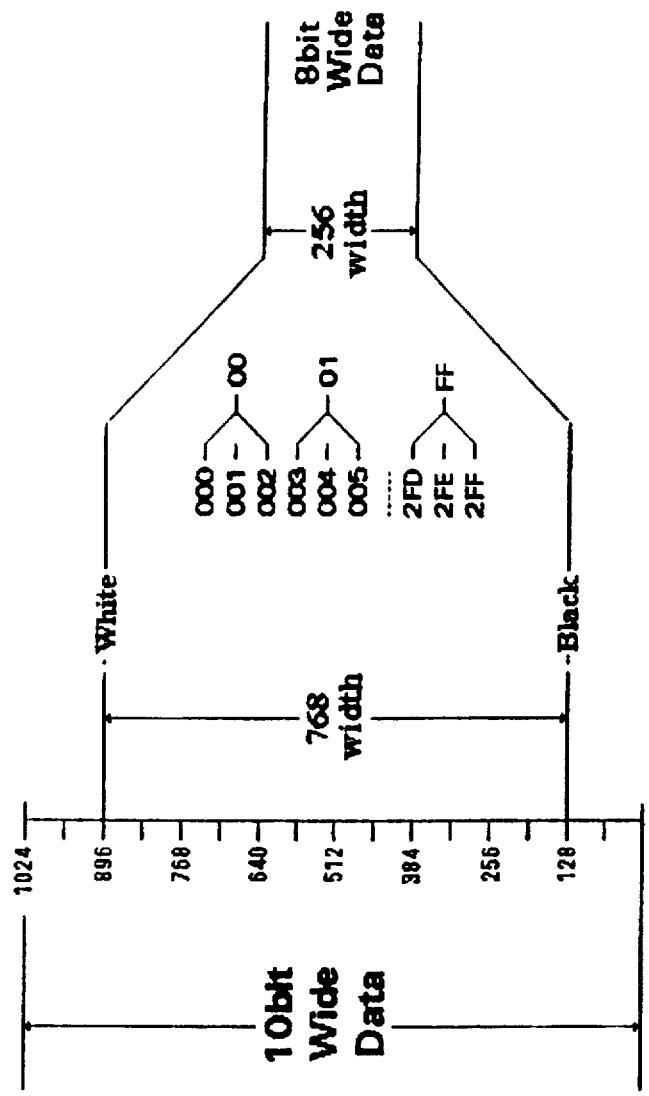
FIG. 6 is a bit-reduction map used to reduce a number of bits provided by the A/D conversion circuit of FIG. 3.

FIG. 6 illustrates a bit-reduction map that is used by the CPU 25 to convert the 10-bit numbers provided by the A/D converter 23 into an 8-bit format. At least two advantages result from this conversion. First, jitter is removed from the CCD pixel responses (normally observed as light fluctuations or other anomalies). Second, the digital signals in the 8-bit format are matched with conventional data formats used by many microcontrollers and digital signal processing parts used in commercial applications.

As shown in FIG. 6, each of the 768 quantization levels (corresponding to a resolution of maximum analog input/768) within the truncated dynamic range of the A/D converter 23 are arranged in groups of three quantization levels (e.g., "000", "001", "002"). The first group of three quantization levels (e.g., 000, 001, and 002) are associated with a first hexadecimal number "00". Similarly, the next group of three quantization levels (003, 004, and 005) are associated with a second hexadecimal number "01". Similarly, the mapping process continues until the uppermost (white most) three quantization levels are mapped into the corresponding hexadecimal number "FF". The arranged groups are preferably stored in a look-up table in memory 27, although other memory or other logic circuits (e.g., application specific integrated circuit) may also be used. While the quantization levels are preferably arranged in groups of three, other groupings may be used as well so as to provide a different number of output bits. Similarly, the above-described bit-reduction map may be used with other traditional mapping processes to remove or impart characteristic shapes from/to the A/D converter's 23 transfer function.

After the look-up table has been compiled and stored in memory 27, in an operational mode of operation, when a new 10-bit number is provided by the A/D converter 23, the CPU 25 compares the 10-bit number with the corresponding 8-bit number stored in the look-up table and outputs the corresponding 8-bit number. Using this mapping approach, jitter is removed from the digitized CCD values and convenient 8-bit-byte data is available for further processing.

Obviously, numerous modifications and variations of the present invention are possible in light of the above teachings. It is therefore to be understood that within the scope of the appended claims, the invention may be practiced otherwise than as specifically described herein.

What is Claimed as new and is desired to be secured by Letters Patent of the United States is:

1. An analog to digital conversion apparatus comprising:
   a converter comprising,
      an analog input terminal which accepts an analog input signal having values ranging from an analog minimum to an analog maximum,
      a conversion portion that converts the analog input signal into a digital signal according to a truncated transfer function, said digital signal having X-bit numbers where X is an integer greater than one, said truncated transfer function having a truncated maximum number that corresponds to said analog maximum and a truncated minimum number that corresponds to said analog minimum, and
      a digital output terminal which outputs the digital signal; and a calibration circuit configured to adjust said truncated transfer function to be within a full transfer function of said converter.

2. The apparatus of claim 1, wherein said calibration circuit comprises:
   a controller that receives said digital signal during a calibration mode of operation and produces a calibration signal in response thereto, wherein said calibration signal sets said truncated maximum number and said truncated minimum number of said truncated transfer function; and
   a reference circuit that receives said calibration signal and produces a reference signal which is applied to said converter.

3. The apparatus of claim 2, wherein said reference circuit comprises a digital to analog converter.

4. The apparatus of claim 3, wherein:
   said converter is configured to provide said full transfer function when calibrated with a full scale reference signal by said digital to analog converter, and said reference signal provided by said reference circuit has a lesser magnitude than said full scale reference signal.

5. The apparatus of claim 1, further comprising a data storage memory that holds a look-up table of calibration values, wherein:
   said analog input terminal of said converter is configured to receive plural analog input signals; and
   said calibration circuit is configured to calibrate said converter for respective of said plural analog input signals by adjusting said truncated transfer function based on respective of said calibration values held in said look-up table.

6. The apparatus of claim 1, wherein:
   said truncated maximum number satisfies $HQL(1-0.5(1-Z))$, where HQL is a highest theoretical quantization level of said conversion portion, and Z is a percentage of a linear range of said full transfer function of said converter, and
   said truncated minimum number satisfies $0.5HQL(1-Z)$.

7. The apparatus of claim 1, further comprising a bit-reduction map device that outputs another digital signal having Y-bit numbers in response to receiving respective of said X-bit numbers, where Y is an integer and Y<X.

8. The apparatus of claim 7, wherein said bit-reduction map device is configured to associate one of said Y-bit numbers with plural of said X-bit numbers.

9. An analog to digital conversion apparatus comprising:
   a converter comprising,
      an analog input terminal which accepts an analog input signal having values ranging from an analog minimum to an analog maximum,
      a conversion portion that converts the analog input signal into a digital signal according to a transfer function, said digital signal having X-bit numbers where X is an integer greater than one, said transfer function having a maximum number that corresponds to said analog maximum and a minimum number that corresponds to said analog minimum, and
      a digital output terminal which outputs the digital signal;
   a bus that receives said digital signal; and
   a bit-reduction map mechanism connected to said bus and configured to output another digital signal having Y-bit numbers in response to receiving respective of said X-bit numbers, where Y is an integer and Y<X.

10. The apparatus according to claim 9, further comprising a calibration circuit configured to adjust said transfer function to be within a full transfer function of said converter, and wherein
   said bit-reduction map mechanism is configured to associate one of said Y-bit numbers with plural of said X-bit numbers.

11. A signal conversion system comprising:
   a charge coupled device comprising plural pixels which produce respective analog signals having an analog maximum when respective of said plural pixels are exposed to a first image and having an analog minimum when exposed to a second image;
   a converter comprising,
      an analog input terminal which accepts at least one of the respective analog signals,
      a conversion portion that converts the at least one of the analog input signals into respective digital signals according to a truncated transfer function, said respective digital signals having X-bit numbers where X is an integer greater than one, said truncated transfer function having a truncated maximum number that corresponds to said analog maximum and a truncated minimum number that corresponds to said analog minimum, and
      a digital output terminal which outputs the respective digital signals;
   a bus which receives the respective digital signals;
   a controller that receives the respective digital signals during a calibration mode of operation and provides corresponding calibration signals in response thereto; and
   a digital to analog converter that receives said calibration signals and produces corresponding reference signals in response thereto, said reference signals being applied to said converter so as to adjust said truncated transfer function for each of said at least one analog signals corresponding to respective of said plural pixels.

12. The system of claim 11, further comprising a data storage memory that holds a look-up table of calibration values corresponding to respective of said plural pixels, and wherein,
   said controller is configured to retrieve respective of said calibration values held in said look-up table.

13. The system of claim 11, wherein said controller comprises a bit-reduction mechanism that converts said X-bit numbers into corresponding Y-bit numbers, where Y is an integer and Y<X.

14. The system of claim 13, wherein said bit-reduction mechanism comprises a dynamic range map mechanism that associate one of said Y-bit numbers with plural of said X-bit numbers.

15. An analog to digital conversion apparatus comprising:
   conversion means for linearly converting an analog input signal into a digital output signal having X-bit numbers where X is an integer greater than one, comprising,
      analog input means for accepting an analog input signal having a maximum value and a minimum value,
      transforming means for transforming the analog input signal into a digital signal according to a truncated transfer function, and
      digital output means for outputting the X-bit numbers of the digital signal; and
   calibrating means for adjusting said truncated transfer function to be within a full transfer function of said conversion means.

16. The apparatus of claim 15, wherein said calibrating means further comprises mapping means for mapping said X-bit numbers into Y-bit numbers, where Y is an integer and Y<X.

17. A method for linearly converting analog signals into digital signals comprising the steps of:

accepting an analog input signal having a maximum value and a minimum value;

adjusting a truncated transfer function of a converter to be within a full transfer function of said converter;

transforming the analog input signal into a digital signal according to the truncated transfer function, said digital signal having X-bit numbers where X is an integer greater than one; and outputting the digital signal.

18. The method of claim 17, wherein:

said accepting step comprises the steps of, accepting for a first time a first analog signal, accepting a second analog signal comprising a minimum value, and accepting for a second time said first analog signal; and said adjusting step comprises the steps of:

identifying as said truncated transfer function a percentage, Z, of said full transfer function that comprises a linear portion of said full transfer function, said truncated transfer function having a maximum number and a minimum number, and said full transfer function having a highest quantization level, HQL;

adjusting a reference signal by a first amount based on a first response of said converter to said step of accepting for a first time said first signal so as to set the maximum number of said truncated transfer function to correspond with said maximum value of said analog input signal;

readjusting said reference signal based on said second analog signal, comprising the steps of, observing a second amount by which said reference signal is changed so as to set the minimum number of said truncated transfer function to correspond with said minimum value of said analog input signal;

changing said reference signal by said second amount if a second response of said converter to said step of accepting said second analog signal is within a first predetermined range of said minimum number, and changing said reference signal by a third amount based on said first and second amounts when said second response is not within said first predetermined range;

adjusting further said reference signal based on said first analog signal, comprising the steps of, observing a fourth amount by which said reference signal is changed so as to set the maximum number of said truncated transfer function to correspond with said maximum value of said input signal, changing said reference signal by the fourth amount if a third response of said converter to said step of accepting for a second time said first analog signal is within a second predetermined range of said maximum number, and changing said reference signal by a fifth amount based on said fourth amount and at least one of said second amount and said third amount when said third response is not within said second predetermined range.

19. The method of claim 17, further comprising the step of converting said X-bit numbers into Y-bit numbers, where Y is an integer and Y<X.

20. The method of claim 19, wherein said converting step comprises the steps of:

storing a map of said X-bit numbers;

associating sets of said X-bit numbers with respective of said Y-bit numbers;

retrieving respective of said Y-bit numbers when respective of said X-bit numbers in said sets are produced in said transforming step; and substituting said respective of said Y-bit numbers for said respective of said X-bit numbers in said sets when produced in said transforming step.

* * * * *